United States Patent
Hsiao et al.

(10) Patent No.: US 6,864,148 B1
(45) Date of Patent: Mar. 8, 2005

(54) CORNER PROTECTION TO REDUCE WRAP AROUND

(75) Inventors: Chia-Shun Hsiao, Cupertino, CA (US); Dong Jun Kim, San Jose, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 10/655,705

(22) Filed: Sep. 5, 2003

(51) Int. Cl.[7] ............... H01L 21/76; H01L 21/3205; H01L 21/31

(52) U.S. Cl. ............... 438/400; 438/424; 438/595; 438/780

(58) Field of Search ............... 438/400, 424, 438/595, 758, 778, 780, 787, 791

(56) References Cited

U.S. PATENT DOCUMENTS 5,741,738 A    4/1998  Mandelman et al. ....... 438/296
6,184,071 B1   2/2001  Lee ............................. 438/197
6,746,935 B2 * 6/2004  De Coster et al. .......... 438/433

\* cited by examiner

*Primary Examiner*—David Zarneke
*Assistant Examiner*—Scott B. Geyer
(74) *Attorney, Agent, or Firm*—MacPherson Kwok Chen & Heid LLP; David S. Park

(57) ABSTRACT

A method and structure are provided with reduced gate wrap around to advantageously control for threshold voltage and increase stability in semiconductor devices. A spacer is provided aligned to field dielectric layers to protect the dielectric layers during subsequent etch processes. The spacer is then removed prior to subsequently forming a part of a gate oxide layer and a gate conductor layer. Advantageously, the spacer protects the corner area o the field dielectric and also allows for enhanced thickness of the gate oxide near the corners.

25 Claims, 8 Drawing Sheets

CORNER PROTECTION TO REDUCE WRAP AROUND

BACKGROUND

1. Field of Invention

The present invention generally relates to semiconductor processing. More particularly, the present invention relates to reducing gate wrap around during manufacture of semiconductor devices.

2. Discussion of the Related Art

Insulated gate field effect transistors ("IGFETs") have become the active electronic element of choice for the majority of digital electronic circuits formed at small size and high integration density. The basic principle of operation of field effect transistors is to use a voltage applied to a gate electrode insulated from the conduction channel of the device to develop an electric field which controls the population of carriers in a body of semiconductor material which forms the conduction channel of the device.

Trench isolation is an isolation technique developed especially for a semiconductor chip with high integration. The trench regions are formed in the semiconductor substrate by recessing the substrate deep enough for isolation and filling the recess with insulating material to provide the isolation among active devices or different well regions.

FIG. 1 illustrates how improper formation of isolation structures may lead to corner effects at the interface of the semiconductor substrate surface and trench, such as "gate wrap around" and "parasitic leakage." A gate oxide layer 116 is formed above a substrate 100 in which isolation trenches are filled with a dielectric 108. A gate conductor layer 118 is formed over the active and field regions.

Parasitic leakage paths have been found because of the proximity of a transistor gate to an edge or corner of a trench. The parasitic leakage paths result from an enhancement of the gate electric field near the trench corner. The electric field is enhanced by the corner's small radius of curvature and the proximity of the gate conductor. Processing can exacerbate the problem by sharpening the corner and thinning the gate dielectric near the corner. In a worst case scenario for corner field enhancement, the gate layer wraps around the trench corner, resulting in so called "gate wrap around," as shown by encircled area 101. This happens when the oxide fill in the isolation trench is recessed below the silicon surface during subsequent etch processing.

Accordingly, the electrical field developed within the conduction channel may not be uniform, particularly at the lateral edges or corners of the conduction channel (which generally coincides with the intersection of the trench and the surface of the semiconductor substrate). The conduction characteristics at the corners of the channel may therefore be quite different from those of the central portion of the channel. In relatively larger (i.e., wider channel) devices, the electric field can be considered as relatively uniform throughout the conduction channel as the planar or channel portion of the transistor generally dominates the on-current characteristics of the transistor. Consequently, device characteristics, such as threshold voltage ($V_t$), of particular interest in digital circuits, are highly predictable and controllable. However, as field effect transistors are made smaller (i.e., devices have a narrower channel), the conduction effects at the corners of the conduction channel become relatively more significant and, in fact, may dominate at sub-micron channel widths. The practical effect of corner conduction is to lower the threshold voltage of the transistor. Additionally, an increased variance in threshold voltage has been observed as device size decreases in the sub-micron regime where very small differences in channel dimensions may greatly affect the relative contributions of corner and channel conduction of transistors.

A scheme for controlling the corner area or edge of a trench is disclosed in U.S. Pat. No. 5,741,738 issued to Mandelman et al. A semiconductor substrate having a planar surface is provided. A trench having a sidewall is provided in the substrate, an intersection of the trench and the surface forming a corner. A dielectric lines the sidewall of the trench and a spacer is self-aligned to the edge of the trench dielectric to protect the corner during subsequent etches, preventing divoting and gate wrap around. However, Mandelman et al. disclose at least a portion of the spacer remains in place after subsequent etches. Disadvantageously, such a method and structure result in less area for the transistor channel per total area, where the total area includes the active area and the trench area.

Therefore, a method and structure to control threshold voltage by preventing corner parasitic conduction and gate wrap around is highly desirable.

SUMMARY

The present invention provides for spacers to be formed and removed during processing to prevent gate wrap around and corner parasitic conduction, thereby allowing for greater control over threshold voltage.

In accordance with an embodiment of the present invention, a method of manufacturing a semiconductor device is provided, comprising forming a trench dielectric that has a sidewall adjacent to the active area of the substrate and forming a spacer over the sidewall. The spacer covers the sidewall at least at a bottom portion, near the active area. The method further comprises exposing the dielectric and spacer to an etchant, with the spacer protecting at least the bottom portion of the sidewall. The spacer is then removed. In one embodiment, the spacer is formed of an anti-reflective coating (ARC).

In accordance with another embodiment of the present invention, a method of manufacturing a semiconductor device comprises providing a substrate having a substantially planar surface and providing a first oxide layer over the substrate. The method further comprises providing a trench in the substrate through the first oxide layer, an intersection of the trench and the surface of the substrate forming a corner. A dielectric layer fills the trench to a level above the first oxide layer and a spacer is formed aligned with the dielectric layer. The method further includes etching a portion of the first oxide layer around the spacer, the spacer protecting the dielectric layer from loss proximate the corner, and providing a second oxide layer over the substrate between remaining portions of the first oxide layer, the second oxide layer having a smaller thickness than the remaining portions of the first oxide layer.

In accordance with another embodiment of the present invention, a method of manufacturing a semiconductor device includes providing a second oxide layer over the substrate between remaining portions of the first oxide layer, the second oxide layer having a lower capacitance per unit area than the remaining portions of the first oxide layer.

In accordance with yet another embodiment of the present invention, a semiconductor device structure is provided, comprising a substrate having a substantially planar surface, a first oxide layer over the surface of the substrate, and a trench in the substrate, an intersection of the trench and the surface of the substrate forming a corner. A dielectric layer fills the trench to a level above the first oxide layer, and a second oxide layer is over the substrate between portions of the first oxide layer, the portions of the first oxide layer having a larger thickness than the second oxide layer.

Advantageously, the present invention allows for uniform and predictable threshold voltage of transistor devices and improved device reliability.

These and other features and advantages of the present invention will be more readily apparent from the detailed description of the embodiments set forth below taken in conjunction with the accompanying drawings.

BRIEF DESCRIPTION OF DRAWINGS

Use of the same reference symbols in different figures indicates similar or identical items. It is further noted that the drawings may not be drawn to scale.

DETAILED DESCRIPTION

FIGS. 2A–2K illustrate a process sequence to form gate structures isolated by trenches with reduced gate wrap around according to one embodiment of the present invention. Advantageously, the present invention allows for semiconductor structures, such as transistors, to be formed with substantially uniform and stable threshold voltage and reduced current leakage.

Figure 2A:
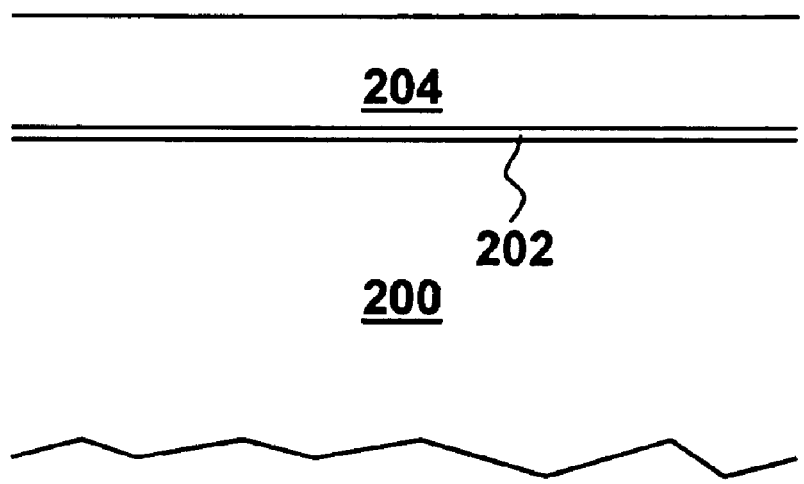
FIG. 2A shows a cross-section view of an oxide layer and a nitride layer that are formed above a semiconductor substrate.

FIG. 2A illustrates a cross-section view of one example of a semiconductor device structure or portion of a semiconductor device structure in which the present invention may be used. As shown in FIG. 2A, layers of material are formed over a semiconductor substrate 200 and trenches 206 (FIG. 2C) are subsequently formed therein. Substrate 200 may be doped by conventional means with dopants at different dosage and energy levels to form wells. Substrate 200 may be a wafer formed from a single crystalline silicon material. Substrate 200 may also comprise other materials, for example, an epitaxial material, a polycrystalline semiconductor material, or other suitable material. It is noted that substrate 200 can further include additional layers, structures, and/or devices.

An oxide layer 202 comprising silicon oxide, in one example, is formed over substrate 200 to serve as a portion of a gate oxide layer for gate structures that are eventually formed. For example, transistors are generally manufactured by placing an undoped polycrystalline silicon ("polysilicon") material over a semiconductor substrate. The polysilicon material is generally separated from the semiconductor substrate by an insulating layer, usually a relatively thin layer of oxide, such as silicon dioxide. The polysilicon material and the oxide are then patterned to form a gate arranged upon a gate oxide with source/drain regions adjacent to and on opposite sides of the gate. The gate and source/drain regions are then implanted with a dopant species. A channel region forms between the source/drain regions. The insulating layer is provided to prevent current from flowing between the gate and the source/drain regions or the channel region.

In one example, oxide layer 202 may be formed in a thermal furnace with an oxygen-containing ambient at a temperature between about 800°C. and about 1,000°C. It is noted that oxide layer 202 may comprise other materials suitable for insulating semiconductor elements. In one example, with no intent to limit the invention thereby, the thickness of oxide layer 202 may be between about 150 Å and about 200 Å. Oxide layer 202 may serve in part as a high voltage portion of a gate oxide layer.

Figure 2B:
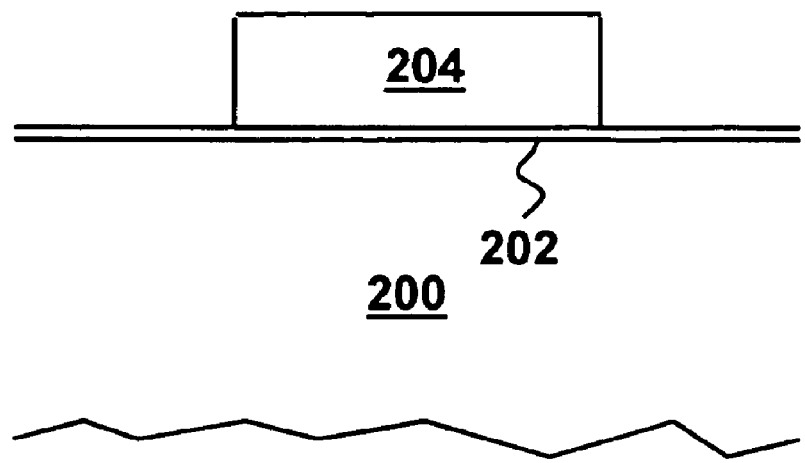
FIG. 2B shows a cross-section view of the structure illustrated in FIG. 2A after a photolithography and patterning process.

As further shown in FIG. 2A, a nitride layer 204 comprising silicon nitride, in one example, is formed above oxide layer 202. Nitride layer 204 may be deposited by low pressure chemical vapor deposition ("LPCVD"), plasma enhanced chemical vapor deposition ("PECVD"), rapid thermal chemical vapor deposition ("RTCVD"), or other applicable techniques. Thereafter, as shown in FIG. 2B, nitride layer 204 is patterned to form a mask using standard photoresist coating, exposure, and development processes known in the conventional lithography technology.

Figure 2C:
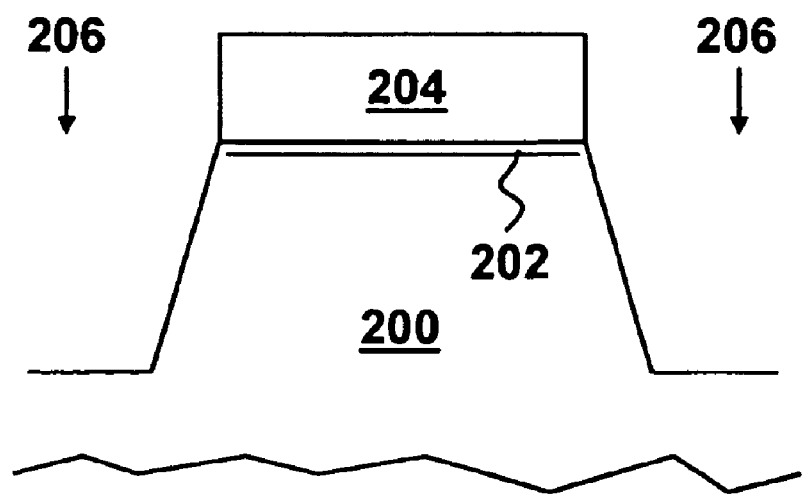
FIG. 2C shows a cross-section view of the structure illustrated in FIG. 2B after trenches are formed.
Figure 2D:
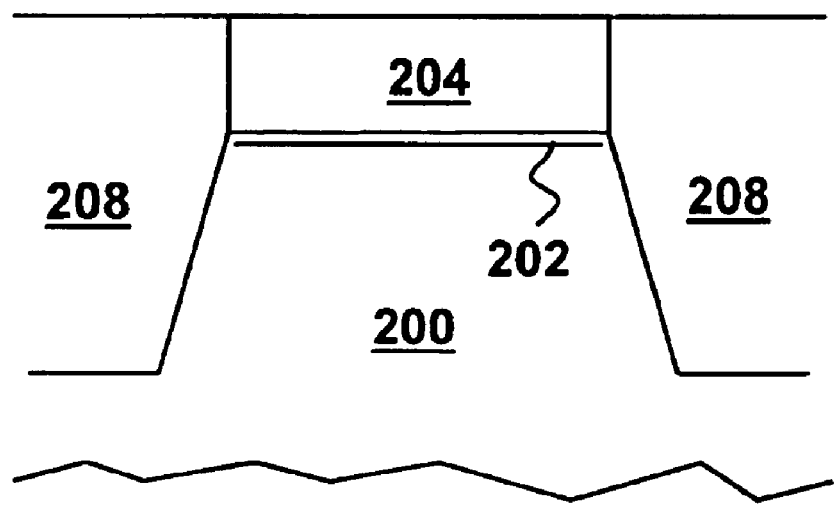
FIG. 2D shows a cross-section view of the structure illustrated in FIG. 2C after a dielectric layer fills the trenches and the structure is subsequently planarized.
Figure 2E:
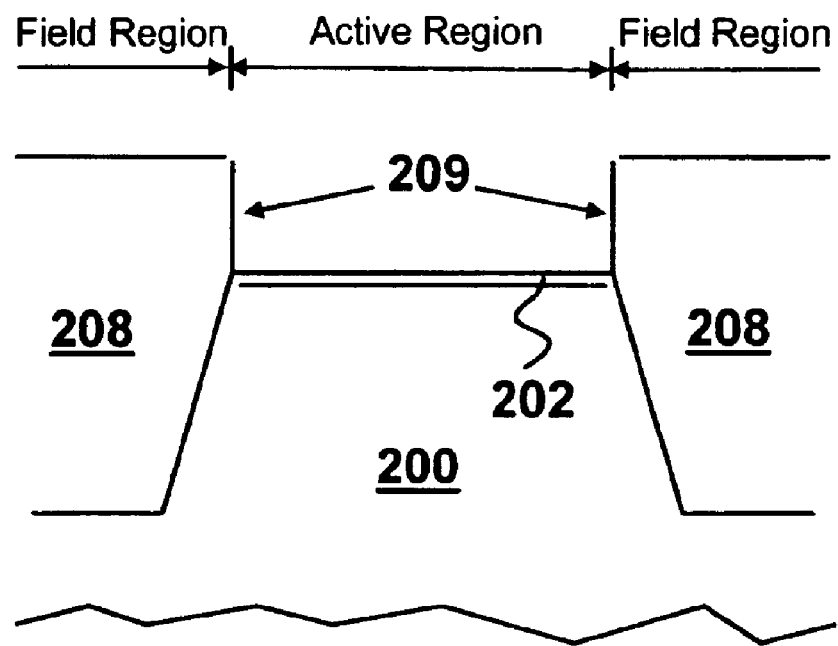
FIG. 2E shows a cross-section view of the structure illustrated in FIG. 2D after the nitride layer is removed.

Referring now to FIG. 2C, oxide layer 202 and substrate 200 are anisotropically etched using patterned nitride layer 204 as a mask to form field regions of isolating trenches 206 and active regions therebetween (FIG. 2E). It should be understood that the present invention may be used with various trench heights and widths and various geometries ranging beyond the aforementioned examples and figures. The patterning step can be performed by conventional anisotropic etch processes, such as reactive ion etch (RIE) processes in one example.

FIG. 2D illustrates the structure of FIG. 2C after formation of a field oxide or dielectric layer 208 to fill trenches 206 to a level above oxide layer 202, in one example to a level above nitride layer 204. This step is subsequently followed by a planarization process, such as chemical mechanical polish, to planarize dielectric layer 208 to a level substantially coplanar with nitride layer 204.

In one embodiment, dielectric layer 208 is formed by HDP-CVD but may be formed by any applicable deposition process. Dielectric layer 208 fills the trench to a level above oxide layer 202, and accordingly, will have different thicknesses based upon trench height, oxide layer thickness, and other requirements of the given geometry. In one example, dielectric layer 208 may comprise silicon dioxide, formed from reaction gases such as silane ($SiH_4$), oxygen ($O_2$), and helium (He). In one example, dielectric layer 208 is deposited using a source radio frequency (RF) for generating radicals in the HDP-CVD process but no bias power or low bias power is applied to the substrate to prevent possible damage to the underlying substrate 200 caused by etching/sputtering. In one embodiment, the HDP-CVD process is performed with a substrate bias power between about 0 watts and about 2,000 watts to form dielectric layer 208 having a thickness of about 6,000 Å for a trench width of about 0.25 µm. Again, it should be understood that the present invention may be used with various trench heights and widths and various geometries ranging beyond the aforementioned examples.

After dielectric layer 208 is deposited, a thermal anneal process may be performed to densify the deposited dielectric and to improve the characteristics of the dielectric as an insulation material.

Patterned nitride layer 204 is subsequently stripped, as illustrated in FIG. 2E. Nitride layer 204 may be stripped by a liquid strip process using hot phosphoric acid ($H_3PO_4$), in one example, and/or an ashing process in an oxygen plasma, in another example, which results in trench dielectric 208 having substantially vertical sidewalls 209 extending above the surface of oxide layer 202. Experimental tuning of the etch conditions is used to determine the time required to recess or remove nitride layer 204.

Figure 2F:
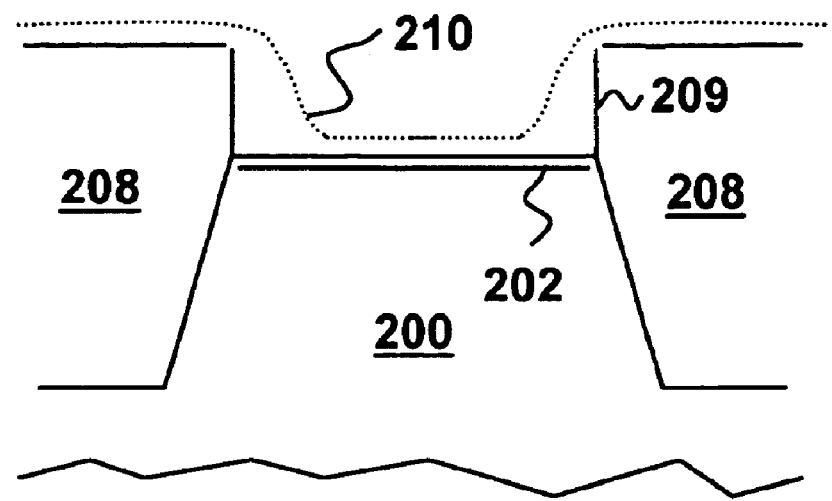
FIG. 2F shows a cross-section view of the structure illustrated in FIG. 2E after a spacer layer is conformally formed over the topography of the structure, in accordance with an embodiment of the present invention.
Figure 2G:
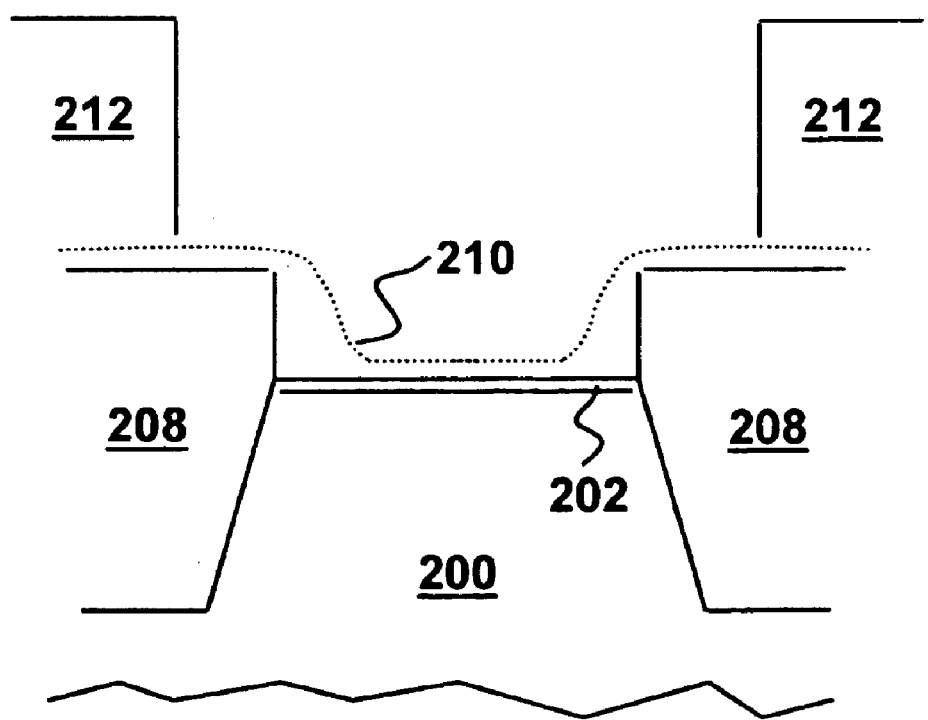
FIG. 2G shows a cross-section view of the structure illustrated in FIG. 2F after formation of a photoresist mask, in accordance with an embodiment of the present invention
Figure 2H:
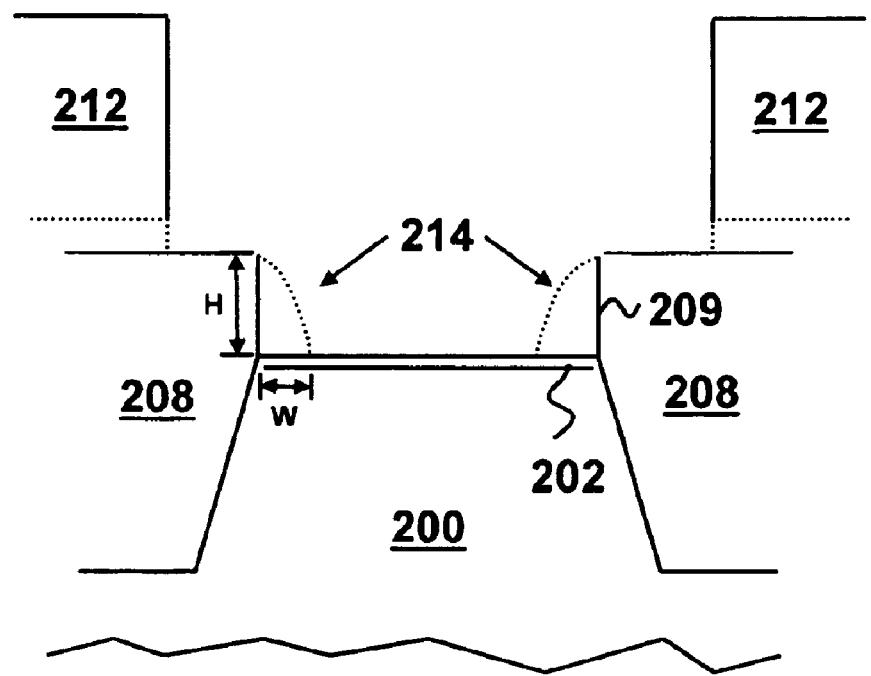
FIG. 2H shows a cross-section view of the structure illustrated in FIG. 2G after formation of spacers, in accordance with an embodiment of the present invention.

In one embodiment of the present invention, FIGS. 2F–2H illustrate a spacer that is formed over oxide layer 202 and aligned to dielectric layer 208 along sidewall 209. Advantageously, the use of spacers protects the dielectric layer from loss proximate the corner during subsequent processing, thereby reducing and/or preventing gate wrap around and corner parasitic leakage.

Referring to FIG. 2F, spacer layer 210 is conformally provided over the topography of dielectric layer 208 and oxide layer 202. In one example, with no intent to limit the invention thereby, layer 210 is formed from an antireflective coating (ARC). Advantageously, the ARC layer minimizes or eliminates unwanted reflection and ghost images which can occur from uncoated surfaces during the subsequent patterning of resist 212 (FIG. 2G). The coating can be optimized for single wavelengths or for a wide wavelength range (broadband coating). Furthermore, the ARC layer may be later ashed by oxygen ($O_2$) for simple removal.

In one example, with no intent to limit the invention thereby, spacer layer comprises propylene glycol monomethyl ether, aromatic sulfur compound, acrylic polymer, non-ionic surfactant, residual acrylate monomer, amidomethyl ether crosslinker, and 2-methoxy-1-propanol. In other embodiments, the ARC layer may be formed of other applicable materials, such as generally a polymer and/or silicon nitride (SiN) and/or silicon oxynitride (SiON), that provide similar properties of reducing light reflection from a coated surface and simple removal together with photoresist.

In one example, spacer layer 210 is provided by a deposition process, and as a result, the layer is thicker at the sides of dielectric layer 208 than on flat areas. spacer layer 210 may be provided by LPCVD, PECVD, RTCVD, spin-on processes, or other applicable coating techniques. In one embodiment, spacer layer 210 has a thickness between about 700 Å and about 900 Å. However, the exact thickness of spacer layer 210 is determined by the size of the gate and requirements of the given geometry.

Referring now to FIG. 2G, a photoresist mask 212 is provided on spacer layer 210 over dielectric 208. Photoresist mask 212 is positioned only over the field dielectric region leaving the active region exposed. In one embodiment, photoresist mask 212 is formed to expose portions of spacer layer 210 over a portion of dielectric layer 208. Photoresist mask 212 is formed using standard photoresist coating, exposure, and development processes known in the conventional lithography technology. Spacer layer 210 absorbs stray radiation reflected from the surface of the underlying layer during the photoresist patterning exposure, thereby eliminating unwanted exposure at the pattern edges and improving the crispness of the image. Accordingly, structures defined using the photoresist mask advantageously have a dimension that is close to the desired dimension.

As illustrated in FIG. 2H, exposed portions of spacer layer 210 are subsequently etched through photoresist mask 212 to form a spacer 214 along interfaces of the active region and the field region, spacer 214 being aligned to dielectric layer 208 along sidewall 209 and above oxide layer 202. Spacer 214 advantageously protects the trench dielectric from attack during subsequent etch steps. Because of the ability of dry etch processes to etch anisotropically (in comparison to wet etch processes, which etch isotropically), dry etching is preferably used at least in part for the spacer formation.

There are three types of dry etch processes: those that have a physical basis (e.g., ion beam milling), those that have a chemical basis (e.g., non-plasma assisted chemical etching), and those that combine both physical and chemical mechanisms (e.g., reactive ion etching and some types of plasma-assisted etching). Primarily physical dry etch methods may not exhibit sufficient selectivity of the superjacent layer over the underlying layer causing punchthrough of the underlying layer. On the other hand, primarily chemical processes typically etch isotropically and therefore do not form vertical sidewalls. Consequently, chemically enhanced ion etching processes that combine the two mechanisms are preferred. Accordingly, in one embodiment, the method of the present invention utilizes a dry etch involving simultaneous ion bombardment and polymerizing chemistry to etch spacer layer 210.

In one embodiment of the present invention, etching of spacer layer 210 forms substantially vertical profile spacers without leaving residue or violating the integrity of the underlying oxide layer. One having ordinary skill in the art will realize that process parameter values will vary depending on the make and model of the etcher used in the process and the geometry of the gate structures involved.

In one embodiment, the etch of spacer layer 210 may be performed in a commercially available 9400 DFM plasma reactor from Lam Research Corporation ("Lam") of Fremont, Calif., described in U.S. Pat. No. 6,218,309 and incorporated by reference herein. Although the Lam reactor has been given as one example, other plasma reactors that are suitable for dry etching may be used for etching spacer layer 210.

A typical plasma reactor includes a plasma processing chamber with a chamber electrode powered by a first power source, such as a radio frequency (RF) power source. Typically, a gas port is provided within the chamber and is arranged for releasing gaseous source materials, e.g., the etchant source gases, into the RF-induced plasma region. The gaseous source materials may be released from ports built into the walls of the chamber itself or through a shower head.

In one embodiment, a wafer is introduced into the chamber and disposed on a chuck or pedestal, which acts as a bottom electrode and can be biased by a second power source. The chuck may be, in one example, an electrostatic chuck, which secures substrate 200 to the chuck's surface by electrostatic force.

By applying power to the top chamber electrode, a plasma may be created within the chamber by causing the molecules of one or more of the inflowing gases to disassociate into respective submolecular constituents (e.g., free radicals or free ions). Power is applied to the electrostatic chuck or pedestal to attract ionized molecules in the plasma toward the wafer surface for sputter etching.

An exhaust port is typically disposed on one side of the chamber and coupled to a pump typically located outside of the chamber. The pump maintains the desired pressure inside the chamber.

Further, the reactor may be controlled by a programmable computer that is programmed to automate the processing of the wafer, including venting of the chamber, transfer of wafers to and from loading modules, and delivery of process gas and electrode power.

In one embodiment, as shown in FIG. 2H, spacers 214 have a width W adjacent the oxide layer between about 400 Å and about 1,000 Å, and a height H adjacent the dielectric between about 400 Å and about 1,000 Å. However, it should be understood that the spacer may have various widths and heights to protect the corner area of varying geometry.

Figure 2I:
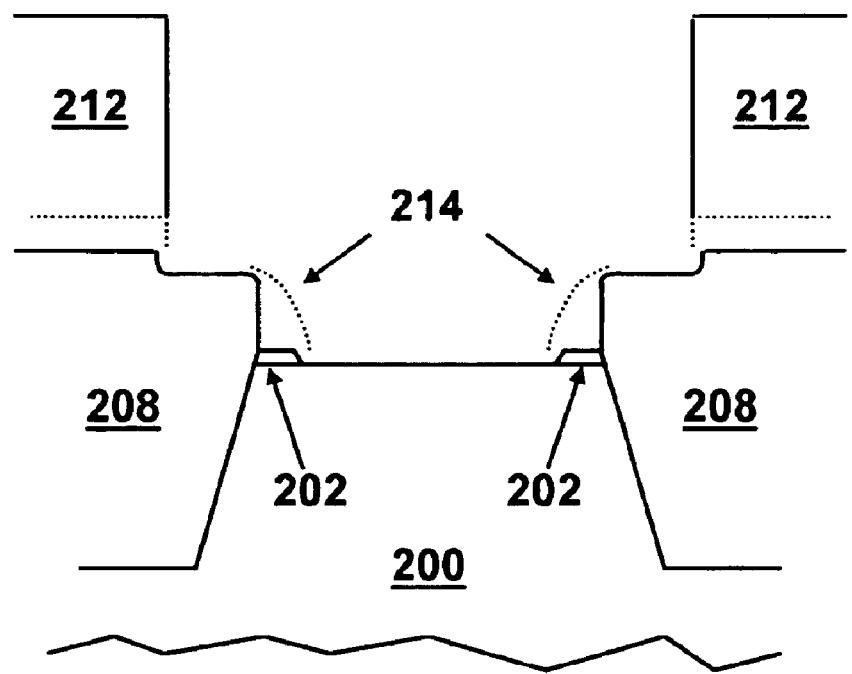
FIG. 2I shows a cross-section view of the structure illustrated in FIG. 2H after removal of a portion of a first oxide layer, in accordance with an embodiment of the present invention.

A subsequent etch step follows the spacer layer etch to strip away exposed oxide layer 202 not protected by spacer 214 and photoresist mask 212, as illustrated in FIG. 2I. This strip step may be performed by conventional wet etch methods, such as by using a conventional diluted HF solution or BOE solution. In one example, with no intent to limit the invention thereby, a wet etch may be performed in a conventional wet etch tank, such as a recirculating, filtered tank, commercially available from Universal Systems located in San Jose, Calif.

Figure 1:
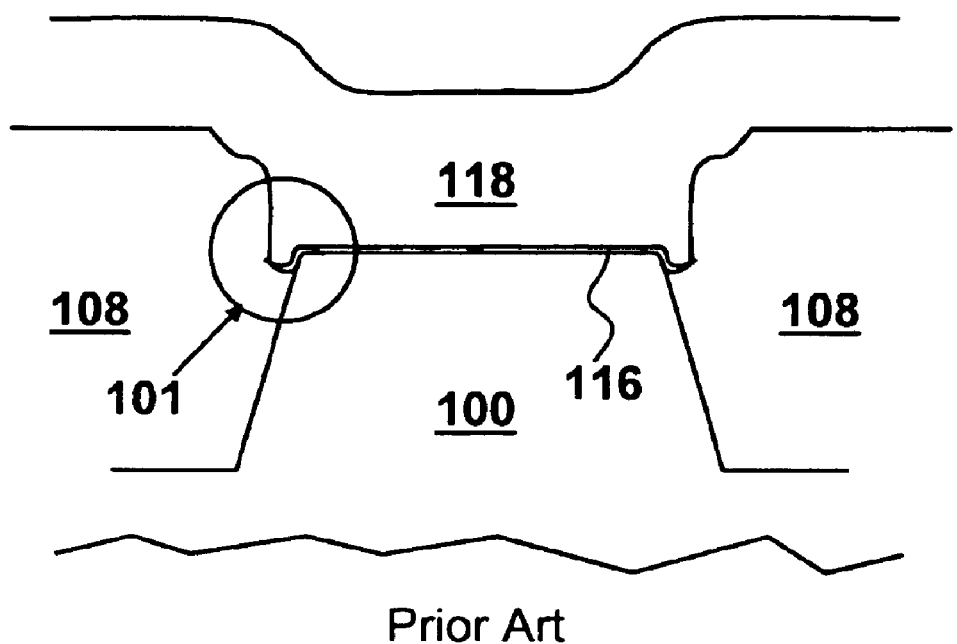
FIG. 1 shows a cross-section view of a semiconductor device structure with gate wrap around.

Advantageously, when portions of oxide layer 202 are stripped away in accordance with the present invention, dielectric layer 208 proximate the corner area is not etched (i.e., no grooving at the edges of the trench) because of the protection from etchant provide by spacer 214. In comparison, FIG. 1 illustrates the disadvantageous grooving that typically occurs during ordinary semiconductor device processing. In the present invention, no grooves are formed because spacer 214 protects the dielectric material from loss during the oxide layer etch, resulting in reduced or no gate wrap around and therefore reduced or no degradation of threshold voltage.

Figure 2J:
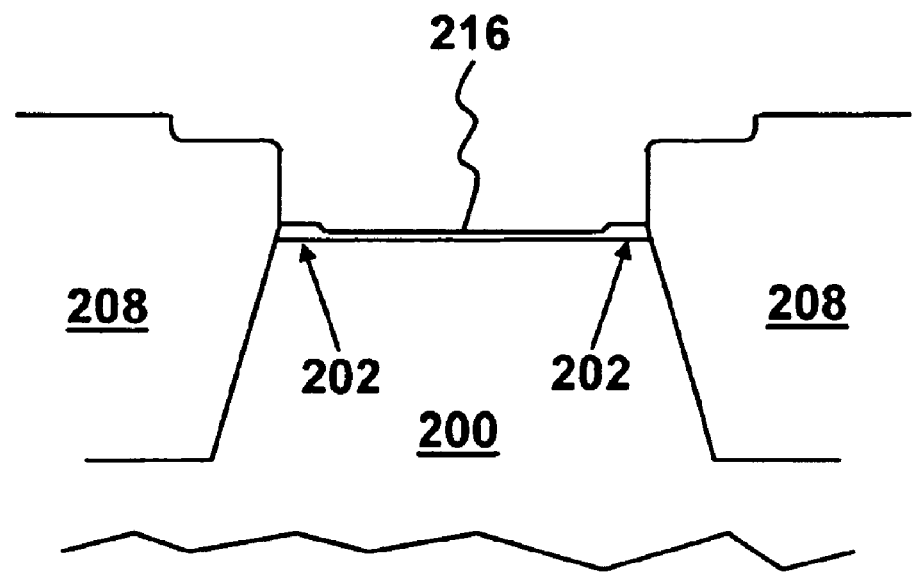
FIG. 2J shows a cross-section view of the structure illustrated in FIG. 2I after the nitride spacers and photoresist mask are removed and a second oxide layer is formed, in accordance with an embodiment of the present invention.

Subsequently, photoresist mask 212 and remaining portions of spacer layer 210 (i.e., spacers 214) are stripped, as illustrated in FIG. 2J. Photoresist mask 212 and remaining portions of spacer layer 210 may be stripped by conventional means, in one example by using a liquid strip process such as hot phosphoric acid ($H_3PO_4$) and/or by ashing in an oxygen plasma as known to those skilled in the art. Advantageously, removing spacers 214 allows for more area for the transistor channel per the same total area, the total area being the active area plus the trench (field) area.

A thin oxide layer 216 is grown between portions of oxide layer 202, as further illustrated in FIG. 2J. In one example, oxide layer 216 may be formed in a thermal furnace with an oxygen-containing ambient at a temperature between about 800° C. and about 1,000° C. to a thickness between about 50 Å and about 70 Å. In this example, oxide layer 216 is thinner than the remaining portions of oxide layer 202 and serves in part as a low voltage area of a gate oxide layer. Furthermore, thicker oxide layer 202 has higher capacitance per unit area than thinner oxide layer 216. Oxide layers 202 and 216 thus serve jointly as the gate oxide layer for gate structures in the active region that are eventually formed.

Advantageously, thicker oxide 202 provided near the trench corners at least partially compensates for the electric field enhancement near the corners. Furthermore, thicker oxide 202 advantageously improves device reliability by preventing gate wrap around. It is noted that layer 216 may generally comprise materials suitable for insulating semiconductor elements and may also comprise a different material from oxide 202. For example, oxide 202 near the corners may include aluminum oxide while layer 216 in the inner portion of the active area may include silicon dioxide.

Figure 2K:
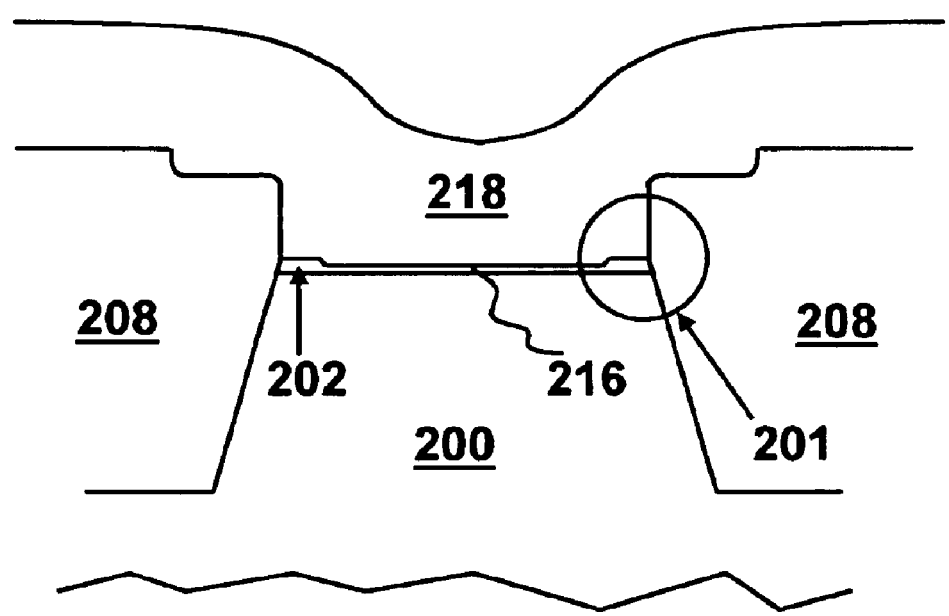
FIG. 2K shows a cross-section view of the structure illustrated in FIG. 2J after a conductor layer is formed over the topography of the structure, in accordance with an embodiment of the present invention.

As shown in FIG. 2K, a gate conductor layer 218 is then formed over dielectric layer 208 and oxide layers 202 and 216. Gate conductor layer 218 is later patterned to form gate structures. Gate conductor layer 218 may be comprised of different layers of material or a single layer of material, and is preferably comprised of polysilicon.

Figure 3A:
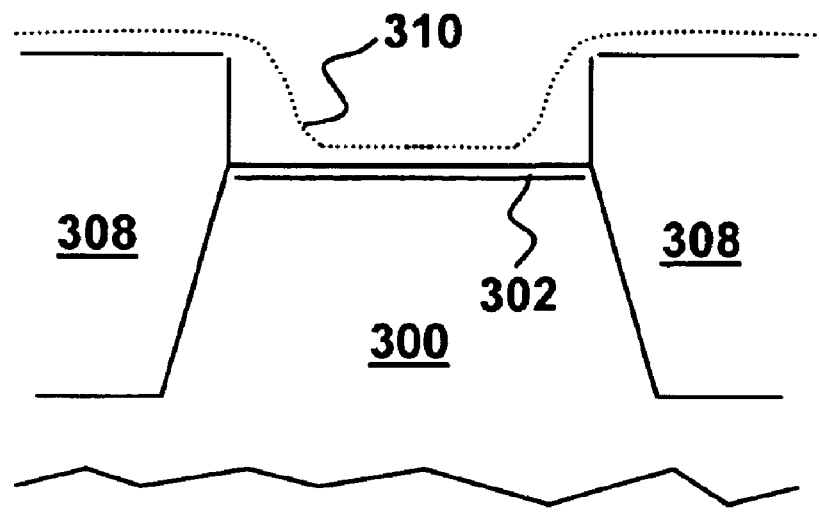
FIG. 3A shows a cross-section view of a semiconductor device structure after a spacer layer is formed over the topography of the structure, in accordance with another embodiment of the present invention.

In another embodiment of the present invention, FIGS. 3A through 3D illustrate another method of forming gate structures with reduced gate wrap around. FIG. 3A illustrates a similar structure as that illustrated in FIG. 2F, with an oxide layer 302 formed over a substrate 300 and trenches in the substrate that are filled with a dielectric layer 308. A spacer layer 310 is then conformally provided over dielectric layer 308 and oxide layer 302. These layers and structures are substantially similar to the layers and structures described above with respect to FIG. 2F. Again, in one embodiment, spacer layer 310 is comprised of an ARC.

Figure 3B:
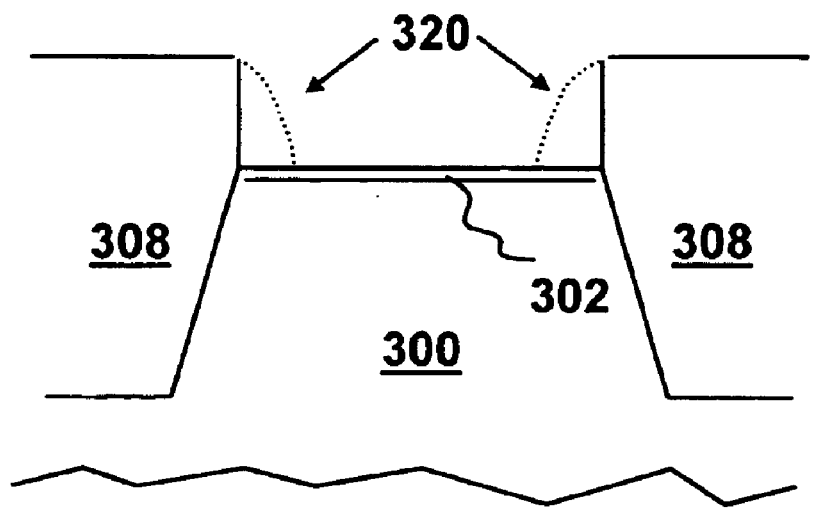
FIG. 3B shows a cross-section view of the structure illustrated in FIG. 3A after formation of spacers, in accordance with another embodiment of the present invention.

As shown in FIG. 3B, the topography of the structure of FIG. 3A is etched to form spacers 320 from spacer layer 310, similar to the procedure used to etch spacers as described above with regard to FIG. 2H. However, a photoresist mask is not applied over the dielectric layer prior to this spacer etch step but may be formed subsequently, as shown in FIG. 3C.

Figure 3C:
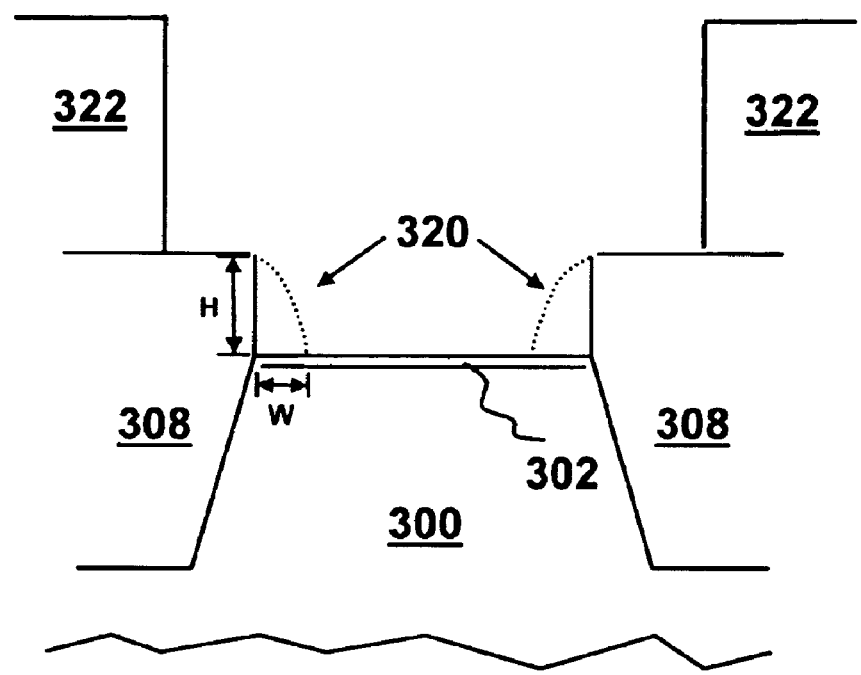
FIG. 3C shows a cross-section view of the structure illustrated in FIG. 3B after formation of a photoresist mask over the dielectric layer, in accordance with another embodiment of the present invention.

Referring to FIG. 3C, a photoresist mask 322 is applied over dielectric layer 308. Photoresist mask 322 is formed using standard photoresist coating, exposure, and development processes known in the conventional lithography technology.

Figure 3D:
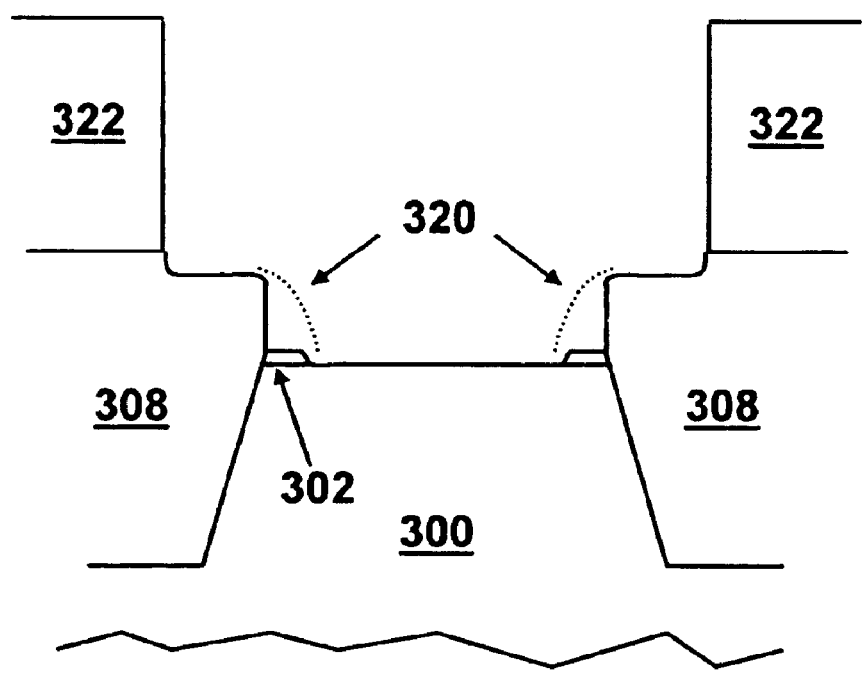
FIG. 3D shows a cross-section view of the structure illustrated in FIG. 3C after removal of a portion of a first oxide layer, in accordance with another embodiment of the present invention.

FIG. 3D then shows the results of a wet etch step in which portions of oxide layer 302 is stripped. Advantageously, the formation of spacer 320 protects the dielectric layer from loss proximate the corner during subsequent processing, thereby reducing and/or preventing gate wrap around and corner parasitic leakage.

Subsequent process steps in this embodiment may be similar to the steps described above with respect to FIGS. 2J and 2K. Photoresist mask 322 and spacers 320 are stripped and a thin oxide layer is grown between remaining portions of oxide layer 302. A gate conductor layer is then deposited over dielectric layer 308 and the oxide layers that serve jointly as the gate oxide for the gate structures patterned from the conductor layer.

The above-described embodiments of the present invention are merely meant to be illustrative and not limiting. Various changes and modifications may be made without departing from this invention in its broader aspects. For example, in alternative embodiments, forming of photoresist mask 212 and 312 may be omitted from the process steps in the above embodiments, and the thickness of trench oxide may be controlled by the initial thickness of pad oxide 202 and 302 and nitride 204. Accordingly, the invention is not limited to particular structures, dimensions, or process parameters. For example, the invention is not limited to MOSFETs but may be used in capacitors, diodes, or any other device that may be formed using an insulated substrate area. Therefore, the appended claims encompass all such changes and modifications as falling within the true spirit and scope of this invention.

We claim:

1. A method of manufacturing a semiconductor device, comprising:
   forming a trench dielectric that has a sidewall adjacent to the active area of the substrate;
   forming a spacer over the sidewall, the spacer covering the sidewall at least at a bottom portion, near the active area;
   exposing the dielectric and spacer to an etchant, with the spacer protecting at least the bottom portion of the sidewall; and
   removing the spacer.

2. The method of claim 1, wherein the spacer is formed of an anti-reflective coating (ARC).

3. The method of claim 2, wherein the spacer is formed of an ARC comprising propylene glycol monomethyl ether, aromatic sulfur compound, acrylic polymer, non-ionic surfactant, residual acrylate monomer, amidomethyl ether crosslinker, or 2-methoxy-1-propanol.

4. The method of claim 2, wherein the spacer is formed of silicon nitride or silicon oxynitride.

5. The method of claim 1, wherein the spacer has a width at the bottom between about 400 Å and about 1,000 Å.

6. The method of claim 1, wherein the spacer is removed by ashing in an oxygen environment.

7. The method of claim 1, wherein the spacer is removed by a liquid strip process using phosphoric acid.

8. A method of manufacturing a semiconductor device, comprising:
   providing a substrate having a substantially planar surface;
   providing a first oxide layer over the substrate;
   providing a trench in the substrate through the first oxide layer, an intersection of the trench and the surface of the substrate forming a corner;
   providing a dielectric layer that fills the trench to a level above the first oxide layer;
   forming a spacer aligned with the dielectric layer;
   etching a portion of the first oxide layer around the spacer, the spacer protecting the dielectric layer from loss proximate the corner; and
   providing a second oxide layer over the substrate between remaining portions of the first oxide layer, the second oxide layer having a smaller thickness than the remaining portions of the first oxide layer.

9. The method of claim 8, wherein the first oxide layer is different from the second oxide layer.

10. The method of claim 9, wherein the first oxide layer is aluminum oxide and the second oxide layer is silicon dioxide.

11. The method of claim 8, wherein the spacer is removed after etching the portion of the first oxide layer.

12. A method of manufacturing a semiconductor device, comprising:
    providing a substrate having a substantially planar surface;
    providing a first oxide layer over the substrate;
    providing a trench in the substrate through the first oxide layer, an intersection of the trench and the surface of the substrate forming a corner;
    providing a dielectric layer that fills the trench to a level above the first oxide layer;
    forming a spacer aligned with the dielectric layer;
    etching a portion of the first oxide layer around the spacer, the spacer protecting the dielectric layer from loss proximate the corner; and
    providing a second oxide layer over the substrate between remaining portions of the first oxide layer, the second oxide layer having a lower capacitance per unit area than the remaining portions of the first oxide layer.

13. The method of claim 12, wherein the first oxide layer is different from the second oxide layer.

14. The method of claim 12, wherein the spacer is removed after etching the portion of the first oxide layer.

15. A method of manufacturing a semiconductor device with reduced gate wrap around, comprising:
    providing a substrate having a substantially planar surface;
    providing a first silicon oxide layer over the substrate;
    providing a trench in the substrate through the silicon oxide layer, an intersection of the trench and the surface of the substrate forming a corner;
    providing a dielectric layer that fills the trench to a level above the first silicon oxide layer;
    providing an anti-reflective coating (ARC) layer conformally over the dielectric layer and the first silicon oxide layer;
    providing a photoresist mask over the dielectric layer;
    etching an exposed portion of the spacer layer through the photoresist mask to form an ARC spacer aligned with the dielectric layer, the ARC spacer protecting the dielectric layer from loss proximate the corner; and
    removing the ARC spacer.

16. The method of claim 15, wherein the first silicon oxide layer has a thickness between about 150 Å and about 200 Å.

17. The method of claim 15, wherein the spacer layer comprises propylene glycol monomethyl ether, aromatic sulfur compound, acrylic polymer, non-ionic surfactant, residual acrylate monomer, amidomethyl ether crosslinker, or 2-methoxy-1-propanol.

18. The method of claim 15, wherein the spacer layer has a thickness between about 700 Å and about 900 Å.

19. The method of claim 15, wherein the photoresist mask is provided over the first silicon oxide layer.

20. The method of claim 15, wherein the ARC spacer has a width adjacent the first silicon oxide layer between about 400 Å and about 1,000 Å.

21. The method of claim 15, further comprising:

etching a portion of the first silicon oxide layer through the photoresist mask and around the ARC spacer;

removing the photoresist mask, a remainder of the spacer layer, and the ARC spacer;

providing a second silicon oxide layer over the substrate; and providing a polysilicon layer over the dielectric layer, over a remaining portion of the first silicon oxide layer, and over the second silicon oxide layer.

22. The method of claim 21, wherein the second silicon oxide layer has a thickness between about 50 Å and about 70 Å.

23. The method of claim 21, wherein the second silicon oxide layer is provided between remaining portions of the first silicon oxide layer.

24. The method of claim 21, wherein the remaining portions of the first silicon oxide layer have a greater thickness than the second silicon oxide layer.

25. The method of claim 15, further comprising:

providing a nitride layer over the first silicon oxide layer;

patterning the nitride layer;

forming a trench in the substrate through the patterned nitride layer;

filling the trench with a dielectric layer to a level substantially coplanar with a top surface of the nitride layer; and removing the nitride layer.

* * * * *